(12) United States Patent
Eilbeck et al.

(10) Patent No.: US 6,733,949 B2
(45) Date of Patent: May 11, 2004

(54) NOVOLAK RESIN MIXTURES AND PHOTOSENSITIVE COMPOSITIONS COMPRISING THE SAME

(75) Inventors: J. Neville Eilbeck, Hillesden (GB); Alberto D. Dioses, Bridgewater, NJ (US)

(73) Assignee: Clariant Finance (BVI) Limited (VG)

( * ) Notice: Subject to any disclaimer, the term of this patent is extended or adjusted under 35 U.S.C. 154(b) by 157 days.

(21) Appl. No.: 10/120,893

(22) Filed: Apr. 11, 2002

(65) Prior Publication Data

US 2003/0207195 A1 Nov. 6, 2003

(51) Int. Cl.[7] .................. G03F 7/023; G03F 7/30; C08L 61/08
(52) U.S. Cl. .............. 430/192; 430/165; 430/191; 430/193; 430/325; 430/326; 430/330; 525/501
(58) Field of Search .................. 430/165, 191, 430/192, 193, 325, 326, 330; 525/501

(56) References Cited

U.S. PATENT DOCUMENTS

| 4,513,077 A | | 4/1985 | Isobe et al. ............ 430/270.1 |
| 4,731,319 A | | 3/1988 | Kohara et al. ............ 430/192 |
| 5,106,718 A | * | 4/1992 | Bartmann et al. ........... 430/191 |
| 5,130,409 A | | 7/1992 | Lazarus et al. ............ 528/155 |
| 5,151,339 A | | 9/1992 | Sarubbi ................ 430/192 |
| 5,178,986 A | * | 1/1993 | Zampini et al. ............ 430/190 |
| 5,200,293 A | * | 4/1993 | Schulz et al. ............ 430/191 |
| 5,235,022 A | | 8/1993 | Jeffries et al. ............ 528/153 |
| 5,238,776 A | | 8/1993 | Zampini ................ 430/192 |
| 5,322,757 A | * | 6/1994 | Ebersole ............... 430/192 |
| 5,403,696 A | * | 4/1995 | Hioki et al. ............. 430/192 |
| 5,407,780 A | * | 4/1995 | Hioki et al. ............. 430/192 |
| 5,494,785 A | | 2/1996 | Sizensky et al. ........... 430/326 |
| 5,674,657 A | | 10/1997 | Tan et al. .............. 430/191 |
| 5,985,507 A | | 11/1999 | Blakeney et al. ........... 430/190 |

* cited by examiner

Primary Examiner—John S. Chu
(74) Attorney, Agent, or Firm—Alan P. Kass

(57) ABSTRACT

Disclosed is an alkali-soluble, film-forming novolak resin mixture containing at least two novolak resins, each novolak resin containing the addition-condensation reaction product of at least one phenolic compound with at least one aldehyde source, wherein the phenolic compound for first novolak resin contains 90–100 mole % of meta-cresol, and the phenolic compound for the second novolak resin contains less than 50 mole % of meta-cresol. Also disclosed is a photosensitive composition, containing an admixture of: a) the above-mentioned novolak resin mixture; b) at least one o-quinone photoactive compound; and c) at least one photoresist solvent. Also disclosed is a method for producing a microelectronic device by forming an image on a substrate, which involves: a) providing the above-mentioned photosensitive composition; b) thereafter, coating a suitable substrate with the photoresist composition from step a); c) thereafter, heat treating the coated substrate until substantially all of the solvent is removed; image-wise exposing the coated substrate; and then removing the imagewise exposed or, alternatively, the unexposed areas of the coated substrate with a suitable developer.

14 Claims, 3 Drawing Sheets

(a)

(b)

NOVOLAK RESIN MIXTURES AND PHOTOSENSITIVE COMPOSITIONS COMPRISING THE SAME

FIELD OF THE INVENTION

This invention relates to the field of film-forming novolak resins, to photosensitive compositions comprising said novolak resins and to a process for forming an image on a substrate utilizing said photosensitive compositions.

BACKGROUND OF THE INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a deprotection reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature, which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

The principal ingredients in many of the conventional (e.g., i-line) positive-working photoresist compositions are an alkali-soluble novolac resin as the film-forming constituent and a quinone diazide compound as the photodecomposable or photosensitive constituent in the form of a mixture or a condensation product of both. Since the sensitivity, resolving power, etc. in the patterning work heavily depend on the kinds and proportion of these two constituents and the manner of combining them in the photoresist composition as well as on the procedure of development after exposure to light, various attempts and proposals have been made hitherto in respect of manufacturing of the photoresist compositions and the way of using the photoresist composition in the photolithography. For example, Japanese Patent Kokai No. 58-17112 teaches that the sensitivity of a positive-working photoresist composition comprising a cresol novolac resin as the film-forming constituent can be improved by suitably selecting the proportion of the cresol isomers in the cresol used in the preparation of the cresol novolac resin.

Typically, in photosensitive compositions, a resin having good thermal stability usually gives a pattern having poor resolution. Likewise, a resin having good resolution has poor thermal stability. A resin system that has both the properties of high thermal stability and high resolution are desirable. The present invention provides such a resin system. The present invention has resulted in finding that the combination of a resin for high thermal stability with a resin for high resolution together produce a resin which when used in photoresists results in preserving both the key properties (thermal stability and high resolution).

U.S. Pat. No. 4,731,319, issued Mar. 15, 1988, to Kohara et al., discloses positive-working photoresist composition comprising: (A) 100 parts by weight of a cresol novolac resin as a film-forming constituent; and (B) from 25 to 60 parts by weight of a naphthoquinone diazide sulfonic acid ester as a photosensitive constituent, the cresol novolac resin being a combination composed of: (A-1) a first cresol novolac resin having a weight-average molecular weight of at least 5000 and produced from an isomeric mixture composed of 60 to 80% of m-cresol and 40 to 20% of p-cresol; and (A-2) a second cresol novolac resin having a weight-average molecular weight not exceeding 5000 and produced from an isomeric mixture composed of 10 to 40% of m-cresol and 90 to 60% of p-cresol, in such a proportion that the overall cresol moiety in the component (A) is composed of from 30 to 46.5% of the m-cresol moiety and from 70 to 53.5% of the p-cresol moiety.

BRIEF DESCRIPTION OF THE FIGURES

FIG. 3(a) utilizes Formulation D, and FIG. 3(b) utilizes Formulation E.

SUMMARY OF THE INVENTION

Figure 1:
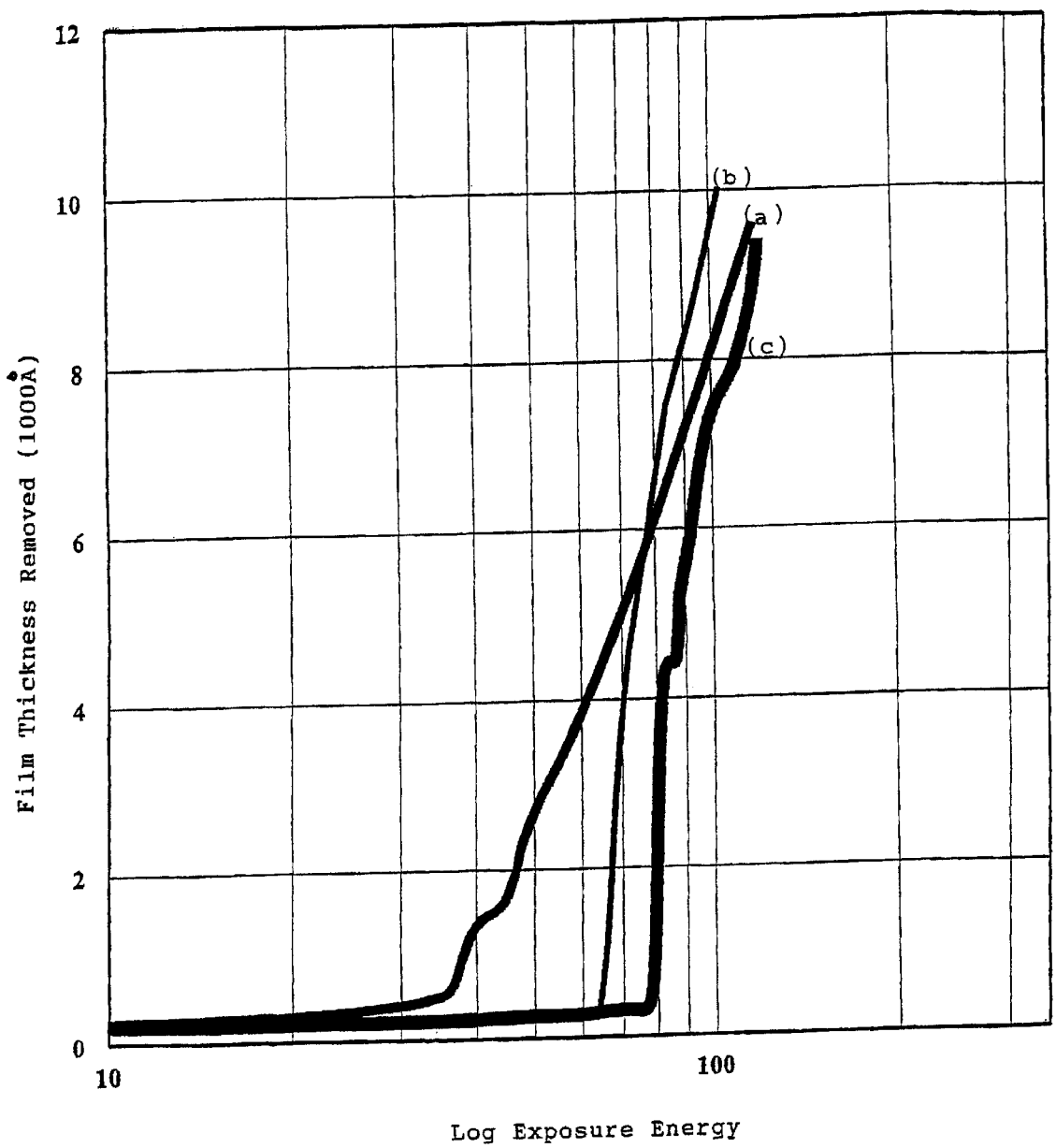
FIG. 1 is a plot of film thickness removed versus log of exposure for three formulations of Example 1. Plot (a) utilizes formulation A, plot B utilizes formulation B, and plot (c) utilizes Formulation C.

The present invention provides alkali-soluble, film-forming novolak resin mixture comprising at least two novolak resins, each novolak resin comprising the addition-condensation reaction product of at least one phenolic compound with at least one aldehyde source, wherein the phenolic compound for first novolak resin comprises 90–100 mole % of meta-cresol, and the phenolic compound for the second novolak resin comprises less than 50 mole % of meta-cresol.

The present invention also provides photosensitive composition, comprising an admixture of: a) the above-mentioned novolak resin mixture; b) at least one o-quinone photoactive compound; and c) at least one photoresist solvent.

The present invention also provides method for producing a microelectronic device by forming an image on a substrate, said method comprising: a) providing the above-mentioned photosensitive composition; b) thereafter, coating a suitable substrate with the photoresist composition from step a); c) thereafter, heat treating the coated substrate until substantially all of the solvent is removed; image-wise exposing the coated substrate; and then removing the imagewise exposed or, alternatively, the unexposed areas of the coated substrate with a suitable developer.

DETAILED DESCRIPTION OF THE INVENTION

The present invention provides alkali-soluble, film-forming novolak resin mixture comprising at least two novolak resins, each novolak resin comprising the addition-condensation reaction product of at least one phenolic compound with at least one aldehyde source, wherein the phenolic compound for first novolak resin comprises 90–100 mole % of meta-cresol, and the phenolic compound for the second novolak resin comprises less than 50 mole %, and in one embodiment 30–45 mole % of meta-cresol. In one embodiment, the phenolic compound for the second novolak resin comprises more than 50 mole %, and in one embodiment 55–75 mole % of para-cresol.

Novolak resins have been commonly used in the art of photoresist manufacture as exemplified by "Chemistry and Application of Phenolic Resins", Knop A. and Scheib, W.; Springer Verlag, N.Y., 1979 in Chapter 4. In one preferred embodiment, the novolak resin mixture of the present invention comprises 10–30% by weight of the first novolak resin and 70–90% by weight of the second novolak resin. The first novolak resin of the present invention preferably has a weight average molecular weight ($M_w$) of 6,000 to 20,000, more preferably 9,000 to 18,000 and most preferably 12,000 to 15,000. The second novolak resin of the present invention preferably has a weight average molecular weight ($M_w$) of 2,000 to 9,000, more preferably 3,000 to 7,000 and most preferably 3500 to 5000.

Aldehyde sources that can be used in this invention includes formaldehyde, paraformaldehyde, trioxane, acetaldehyde, chloroacetaldehyde, and reactive equivalents of these aldehyde sources. Among these formaldehyde and paraformaldehyde are preferable. In addition mixtures of two or more different aldehydes can be used.

The acid catalyst used for the addition-condensation reaction includes hydrochloric acid, sulfuric acid, formic acid, acetic acid, oxalic acid, p-toluenesulfonic acid and the like.

The present invention also provides a photosensitive composition comprising an admixture of (a) the aforementioned novolak resin mixture of the present invention, (b) at least one o-quinone photoactive compound, and (c) at least one photoresist solvent. The photosensitive composition can be either a positive acting or a negative acting photosensitive composition.

In one embodiment, the novolak resin mixture comprises 5 to 40% by weight of the photosensitive composition, and in one embodiment 10 to 35%, and in one embodiment 20 to 30% by weight of the photosensitive composition.

The o-quinone photoactive component (hereafter referred to as PAC) used in the present invention may be any o-quinone diazide ester of a polyhydroxy compound. Preferably, it is provided by esterification of 1,2-Napthoquinone diazide-5-sulfonyl chloride, 1,2-Naphthoquinone diazide4-sulfonyl chloride, 2-1-Naphthoquinone diazide-5-sulfonyl chloride, or 2-1-Naphthoquinone diazide 4-sulfonyl chloride with a polyhydroxy compound having 2–7 phenolic moieties and in the presence of basic catalyst. Examples of structures of such Napthoquinone sulfonate esters are shown below.

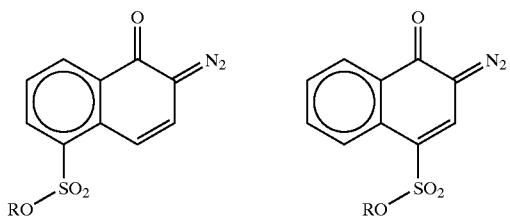

1,2-Naphthoquinone diazide-5-sulfonate is shown on the left above, and 4-sulfonate on the right. These structures can also be referred to as 2,1-Diazonaphoquinone sulfonates. The "R" group refers to the polyhydroxy compound. Similarly, 2-1-Naphthoquinone diazide-5-sulfonate (left) and 4-sulfonate (right) are shown below (the structures below can also be referred to as 1,2-Diazonaphthoquinone sulfonates)

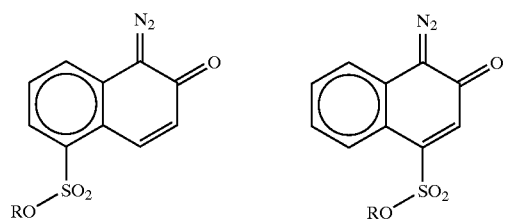

Preferably, the number of the phenolic moieties per one molecule of the polyhydroxy compound used as a backbone of PAC is in the range of 2–7, and more preferably in the range of 3–5.

Some representative examples of polyhydroxy compounds are:
(a) Polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2'4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, and 2,3,4,3', 4',5'-hexahydroxybenzophenone;

(b) Polyhydroxyphenylalkylketones such as 2,3,4-trihydroxyacetophenone, 2,3,4-trihydroxyphenylpentylketone, and 2,3,4-trihydroxyphenylhexylketone;

(c) Bis(polyhydroxyphenyl)alkanes such as bis(2,3,4-trihydroxyphenyl)methane, bis(2,4-dihydroxyphenyl) methane, and bis(2,3,4-trihydroxyphenyl)propane;

(d) Polyhydroxybenzoates such as propyl 3,4,5-trihydroxy-benzoate, phenyl 2,3,4-trihydroxybenzoate, and phenyl 3,4,5-trihydroxybenzoate;

(e) Bis(polyhydroxybenzoyl)alkanes or bis(polyhydroxybenzoyl)aryls such as bis(2,3,4-trihydroxybenzoyl)methane, bis(3-acetyl4,5,6-trihydroxyphenyl)methane, bis(2,3,4-trihydroxybenzoyl)benzene, and bis(2,4,6-trihydroxybenzoyl)benzene;

(f) Alkylene di(polyhydroxybenzoates) such as ethyleneglycol-di(3,5-dihydroxybenzoate) and ethylene glycoldi(3,4,5-trihydroxybenzoate);

(g) Polyhydroxybiphenyls such as 2,3,4-biphenyltriol, 3,4,5-biphenyltriol, 3,5,3'5'-biphenyltetrol, 2,4,2',4'-biphenyltetrol, 2,4,6,3',5'-biphenylpentol, 2,4,6,2',4',6'-biphenylhexol, and 2,3,4,2',3',4'-biphenylhexol;

(h) Bis(polyhydroxy)sulfides such as 4,4'-thiobis(1,3-dihydroxy)benzene;

(i) Bis(polyhydroxyphenyl)ethers such as 2,2'4,4'-tetrahydroxydiphenyl ether;

(j) Bis(polyhydroxyphenyl)sulfoxides such as 2,2'4,4'-tetrahydroxydiphenylsulfoxide;

(k) Bis(polyhydroxyphenyl)sulfones such as 2,2',4,4'-tetrahydroxydiphenylsulfone;

(l) Polyhydroxytriphenylmethanes such as tris(4-hydroxyphenyl)methane), 4,4',4"-trihydroxy-3,5,3',5'-tetramethyltriphenylmethane, 4,4',3",4"-tetrahydroxy-3,5,3',5'-tetramethyltriphenylmethane, 4,4',2",3",4"-pentahydroxy-3,5,3',5'-tetramethyltriphenylmethane, 2,3,4,2',3',4'-hexahydroxy-5,5'-diacetyltriphenylmethane, 2,3,4,2',3',4',3",4"-octahydroxy-5,5-diacetyltriphenylmethane, and 2,4,6,2',4',6'-hexahydroxy-5,5'-dipropionyltriphenylmethane;

(m) Polyhydroxy-spirobi-indanes such as 3,3,3',3'-tetramethyl-1,1'-spirobi-indane-5,6,5',6'-tetrol, 3,3,3'3'-tetramethyl-1,1'-spirobi-indane-5,6,7,6'6',7'-hexol, and 3,3,3'3'-tetramethyl-1,1'-spirobi-indane4,5,6,4',5',6'-hexol;

(n) Polyhydroxyphthalides such as 3,3-bis(3,4-dihydroxyphenyl)phthalide, 3,3-bis(2,3,4-trihydroxyphenyl)phthalide, and 3',4',5',6'-tetrahydroxyspiro(phthalide-3,9'-xanthene);

(o) Polyhydroxy compounds described in JP No. 4-253058 such as alpha, alpha' alpha"-tris(4-hydroxyphenyl)-1,3,5-triisopropylbenzene, alpha, alpha', alpha"-tris(3,5-dimethyl-4-hydroxyphenyl)-1,3,5-triisopropylbenzene, alpha, alpha', alpha"-tris(3,5-diethyl-4-hydroxyphenyl)-1,3,5-triisopropylbenzene, alpha, alpha', alpha"-tris(3,5-di-n-propyl-4-hydroxyphenyl)-1,3,5-tri-isopropylbenzene, alpha, alpha', alpha"-tris(3,5-diisopropyl-4-hydroxyphenyl)-1,3,5-triisopropylbenz ene, alpha, alpha', alpha"-tris(3,5-di-n-butyl-4-hydroxyphenyl)-1,3,5-triisopropylbenzene, alpha, alpha', alpha"-tris(3-methyl-4-hydroxyphenyl)-1,3,5-triisopropyl-benzene, alpha, alpha', alpha"-tris(3-methoxy4-hydroxyphenyl)-1,3,5-triisopropylbenzene, alpha, alpha', alpha"-tris(2, 4-dihydroxyphenyl)-1,3,5-triisopropylbenzene, 2,4,6-tris(3,5-dimethyl4-hydroxyphenylthiomethyl) mesitylene, 1-[alpha-methyl-alpha-(4"-hydroxyphenyl)ethyl]4-[alpha, alpha'-bis(4"-hydroxyphenyl)ethyl]benzene, 1-[alpha-methyl-alpha-(4'-hydroxyphenyl)ethyl]-3-[alpha, alpha'-bis(4"-hydroxy-phenyl)ethyl]benzene, 1-[al pha-methyl-alpha-(3',5'-dimethyl-4'-hydroxyphenyl)ethyl]benzene, 1-[alpha-methyl-alpha-(3'-methoxy4'-hydroxyphenyl)ethyl]4-[alpha', alpha'-bis(3'-methoxy4'-hydroxyphenyl)ethyl]benzene, and 1-[alpha-methyl-alpha-(2',4'-dihydroxyphenyl)ethyl]4-[alphal, alpha'-bis(4'-hydroxyphenyl)ethyl]benzene.

Other examples of o-quinonediazide photoactive compounds include condensation products of novolak resins with an o-quinonediazide sulfonyl chloride. These condensation products (also called capped novolaks) may be used instead of o-quinonediazide esters of polyhydroxy compounds or used in combination therewith. Numerous U.S. Patents describe such capped novolaks. U.S. Pat. No. 5,225, 311 is one such example.

Particularly useful PACs are the o-quinonediazidesulfonyl esters of polyhydroxy phenolic compounds represented by formulae (I)–(VIII), with compounds (IV)–(VIII), being the most preferred.

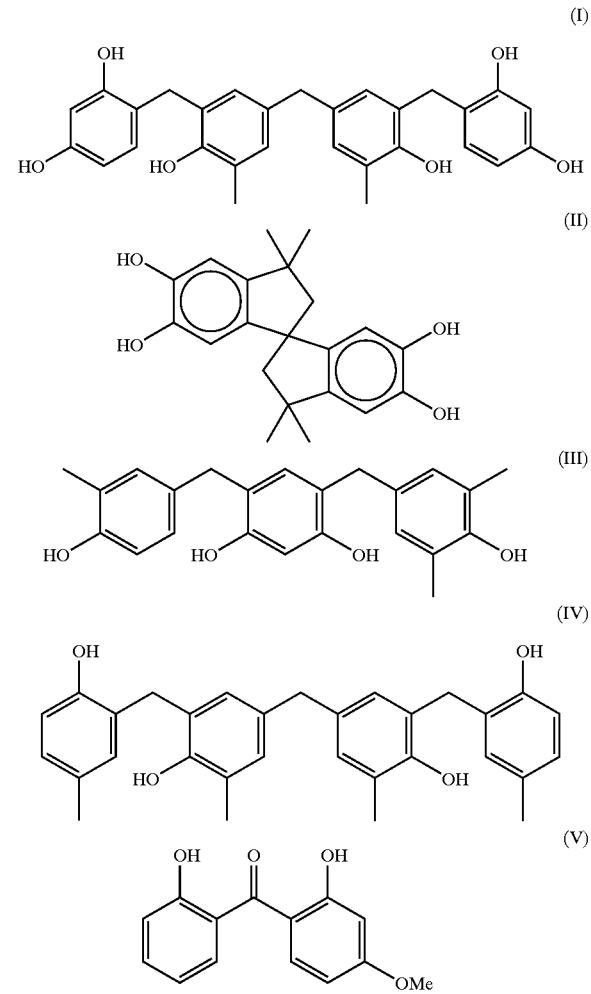

-continued

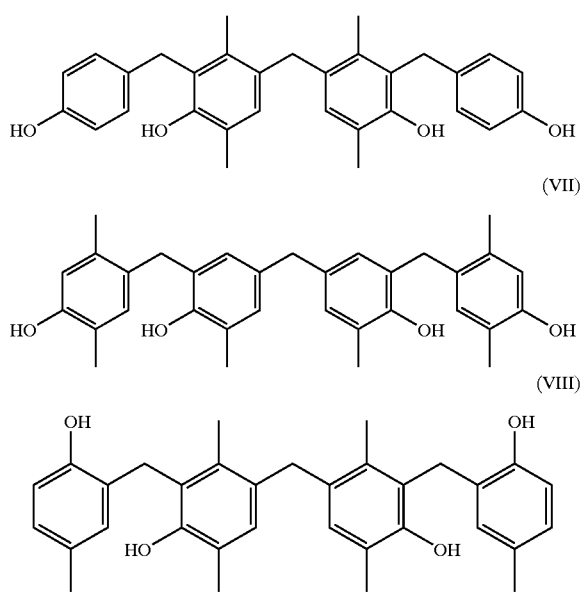

The esterification step for the PAC synthesis is carried out with a basic catalyst such as sodium hydroxide, sodium carbonate, triethylamine, N-methylmorpholine, N-methyldiethylenediamine, 4-dimethylaminopyridine, or combinations thereof.

The following solvents are useful in the above esterification reaction: dioxane, acetone, tetrahydrofuran, methyl ketone, N-methyl-2-pyrrolidone, chloroform, methyl chloroform, trichloroethylene, dichloroethane, or combinations thereof.

The degree of the esterification can be controlled by adjusting the molar ratio of the polyhydroxy compound to 1,2-naphthoquinonediazide-5-(and/or -4-) sulfonyl chloride where the degree of the esterification is defined as a mole percent of the phenolic hydroxyl group of the polyhydroxy compound incorporated with DNQ moiety. The degree of esterification of the polyhydroxy backbone can be controlled by adjusting the molar ratio of the hydroxyl groups bound to the polyhydroxy backbone to DNQ sulfonyl chloride moieties in the feedstock. Preferably, this ratio is greater than 1.0 so that not all available hydroxyl groups are derivitized with DNQ moieties.

The amount of PAC in the present photoresist composition is preferably in the range of 10–60 parts by weight per 100 parts of novolak resin, and more preferably 15–50 parts by weight per 100 parts of novolak resin.

Useful photoresist solvents include, but are not limited to, ethyleneglycol monomethyl ether, ethyleneglycol monoethyl ether, propylene glycol monomethyl ether (PGME) ethyleneglycol monoethyl ether acetate, propyleneglycol alkyl ether acetate (such as propyleneglycol methyl ether acetate (PGMEA), propyleneglycol propyl ether acetate), methylbenzene, dimethylbenzene, methylethyl ketone, 2-heptanone, anisole, 3-methyl-3-methoxybutanol, cyclohexanone, ethyl-2-hydroxypropionate(ethyl lactate (EL)), ethyl-2-hydroxy-2-methyl propionate, ethyl hydroxyacetate, 2-hydroxy-3-methyl butanoate, methyl-3-methoxypropionate, ethyl-3-methoxy propionate, ethyl-3-ethoxypropionate, methyl-3-ethoxy propionate, methyl pyruvate, ethyl pyruvate, butyl acetate, and propyleneglycol monomethylether propionate. These organic solvents may be used either individually or in combination (i.e., as mixtures with others).

In one embodiment, the solvent comprises 30 to 90% by weight, and in one embodiment, 40 to 80%, and in one embodiment, 50–70% by weight of the photosensitive composition.

Optional ingredients for the photoresist compositions of the present invention include colorants, dyes, anti-striation agents, leveling agents, plasticizers, adhesion promoters, speed enhancers, solvents and such surfactants as non-ionic surfactants, which may be added to the solution of the film forming resin, sensitizer and solvent before the photoresist composition is coated onto a substrate. Examples of dye additives that may be used together with the photoresist compositions of the present invention include Methyl Violet 2B (C.I. No. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of the film forming resin and sensitizer. The dye additives help provide increased resolution by inhibiting back scattering of light off the substrate.

Anti-striation agents may be used at up to a five percent weight level, based on the combined weight of the film forming resin and sensitizer. Plasticizers which may be used include, for example, phosphoric acid tri-(beta-chloroethyl)-ester; stearic acid; dicamphor; polypropylene; acetal resins; phenoxy resins; and alkyl resins, at one to ten percent weight levels, based on the combined weight of the film forming resin and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)-ethyltrimethoxysilane; p-methyl-disilane-methyl methacrylate; vinyl trichlorosilane; and gamma-amino-propyl triethoxysilane, up to a 4 percent weight level, based on the combined weight of the film forming resin and sensitizer. Development speed enhancers that may be used include, for example, picric acid, nicotinic acid or nitrocinnamic acid up to a 20 percent weight level, based on the combined weight of the film forming resin and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course are substantially removed after coating of the photoresist solution on a substrate and subsequent drying. Non-ionic surfactants that may be used include, for example, nonylphenoxy poly(ethyleneoxy) ethanol; octylphenoxy ethanol at up to 10% weight levels, based on the combined weight of the film forming resin and sensitizer.

The present invention also provides a method for producing a microelectronic device by forming an image on a substrate, said method comprising: a) providing the aforementioned photosensitive composition; b) thereafter, coating a suitable substrate with the photoresist composition from step a); and c) thereafter, heat treating the coated substrate until substantially all of the solvent is removed; image-wise exposing the coated substrate; and then removing the imagewise exposed or, alternatively, the unexposed areas of the coated substrate with a suitable developer.

The photoresist composition can be applied to the substrate by any conventional method used in the photoresist art, including dipping, spraying, whirling and spin coating. When spin coating, for example, the resist solution can be adjusted with respect to the percentage of solids content, in order to provide a coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist composition may also be coated over an antireflective coating.

The photoresist compositions produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane, preferably hexamethyl disilazane (HMDS).

The photoresist composition is coated onto the substrate, and the coated substrate is heat treated until substantially all of the solvent is removed. In one embodiment, heat treatment of the coated substrate involves heating the coated substrate at a temperature from 70° C. to 150° C. for from 30 seconds to 180 seconds on a hot plate or for from 15 to 90 minutes in a convection oven. This temperature treatment is selected in order to reduce the concentration of residual solvents in the photoresist composition, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from 95° C. to 120° C. The treatment is conducted until the rate of change of solvent removal becomes relatively insignificant. The temperature and time selection depends on the photoresist properties desired by the user, as well as the equipment used and commercially desired coating times.

The coated substrate can then be exposed to actinic radiation, e.g., radiation at wavelength of from 100 nm to 450 nm (including i-line (365 nm), g-line (436 nm), deep UV (248 nm), ArF (193 nm) and $F_2$ (157 nm) radiation), x-ray, electron beam, ion beam or laser radiation, in any desired pattern, produced by use of suitable masks, negatives, stencils, templates, etc.

The substrate coated with the photoresist composition is then optionally subjected to a post exposure second baking or heat treatment, either before or after development. The heating temperatures may range from 90° C. to 150° C., more preferably from 100° C. to 130° C. The heating may be conducted for from 30 seconds to 2 minutes, more preferably from 60 seconds to 90 seconds on a hot plate or 30 to 45 minutes by convection oven.

The exposed photoresist-coated substrates are developed to remove the image-wise exposed areas (positive photoresists), or the unexposed areas (negative photoresists), by immersion in an alkaline developing solution or developed by a spray development process. The solution is preferably agitated, for example, by nitrogen burst agitation. The substrates are allowed to remain in the developer until all, or substantially all, of the photoresist coating has dissolved from the exposed or unexposed areas. Developers can include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

EXAMPLES

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight, all temperatures are in degrees Centigrade, and all molecular weights are weight average molecular weight. The unit "ml/min" indicates is an abbreviated form for milliliters/minute.

Example 1

TABLE 1

Formulations of a photosensitive compositions

| Ingredient | Weight (parts) Formulation C | Weight (parts) Formulation A (control) | Weight (parts) Formulation B (control) |
|---|---|---|---|
| MPT 542 resin[1] | 1.7 | — | 2.0 |
| HPN 507[2] | 0.3 | 2.0 | — |
| DR 176[3] | 0.65 | 0.65 | 0.65 |
| 2-heptanone | 5.56 | 5.56 | 5.56 |
| Anisole | 0.62 | 0.62 | 0.62 |
| FC-430 (5%)[4] | 2 drops | 2 drops | 2 drops |

[1]A novolak resin (unfractionated) based on m-cresol/p-cresol/trimethylphenol in (5:4:2) molar proportions, having a dissolution rate of 113 Å/sec using AZ® MIF-300 developer (0.261N tetramethylammonium hydroxide (TMAH), all available from AZ Electronic Materials, Clariant Corporation; instead of "MPT 542", another resin, "HPN 527", based on p-cresol, and available from Clariant, can also be used.
[2]A novolak resin based on m-cresol; available from AZ Electronic Materials, Clariant Corporation;
[3]An o-quinone diazidesulfonyl bis-ester of a polyhydroxy compound represented by structure (VIII) in the specification; available from AZ Electronic Materials, Clariant Corporation;
[4]Fluorooctanoic acid (leveling agent); available from 3M.

FIG. 1 is a plot of film thickness removed versus log of exposure (exposure energy being measured in millijoules/square centimeter (mJ/cm$^2$). Plot (a) utilizes Formulation A, plot (b) utilizes Formulation B, and plot (c) utilizes Formulation C from Example 1 above. The resin in Formulation A produces a formulation having a high thermal stability. The resin in Formulation B produces a formulation having high resolution. The Figure shows that Formulation C, utilizing a mixture of the resins in Formulation A and B has an excellent contrast, being comparable to that of Formulation B, showing that a little change in exposure energy gives rise to a large change in film thickness removed. Formulation C, also has a high resolution and sensitivity, having a dose to print value of 230 mJ/cm$^2$, and has a thermal stability similar to that of Formulation A (not shown).

Example 2

TABLE 2

Formulation of a photosensitive compositions

| Ingredient | Weight (parts) Formulation E | Weight (parts) Formulation D (control) |
|---|---|---|
| MPT resin[5] | 1.6 | — |
| Meta resin[6] | 0.4 | 0.4 |
| Ortho resin[7] | — | 1.6 |
| DR 167[8] | 0.60 | 0.60 |
| 2-heptanone | 6.06 | 6.06 |

[5]An unfractionated novolak resin based on m-cresol/p-cresol/trimethylphenol, having a dissolution rate of 550 Å/sec using AZ ® MIF-300 developer (0.261N tetramethylammonium hydroxide (TMAH).; available from AZ Electronic Materials, Clariant Corporation;
[6]A fractionated novolak resin based on m-cresol, having a dissolution rate of 113 Å/sec using AZ ® MIF-300 developer; available from AZ Electronic Materials, Clariant Corporation;
[7]A novolak resin (unfractionated) based on o-cresol, having a dissolution rate of 1017 Å/sec using AZ ® MIF-300 developer; available from AZ Electronic Materials, Clariant Corporation;
[8]Photoactive compound sensitizer-An o-quinone diazidesulfonyl ester of a polyhydroxy compound represented by structure (VII) in the specification, wherein an average of 2.8 hydroxy groups are esterified; available from AZ Electronic Materials, Clariant Corporation.

Figure 2:
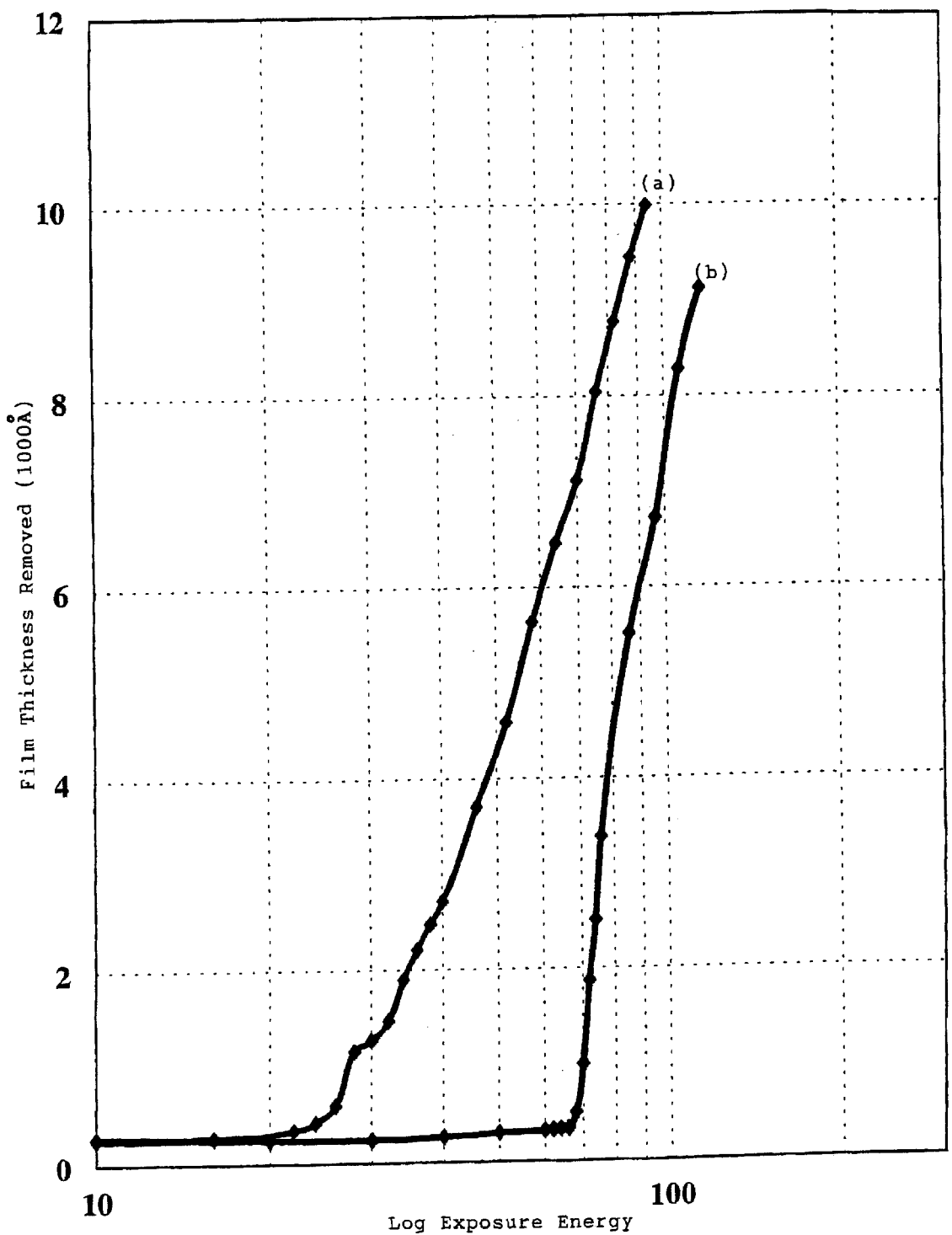
FIG. 2 is a plot of film thickness removed versus log of exposure for two formulations of Example 2. Plot (a) utilizes Formulation D, and plot (b) utilizes Formulation E.
Figure 3:
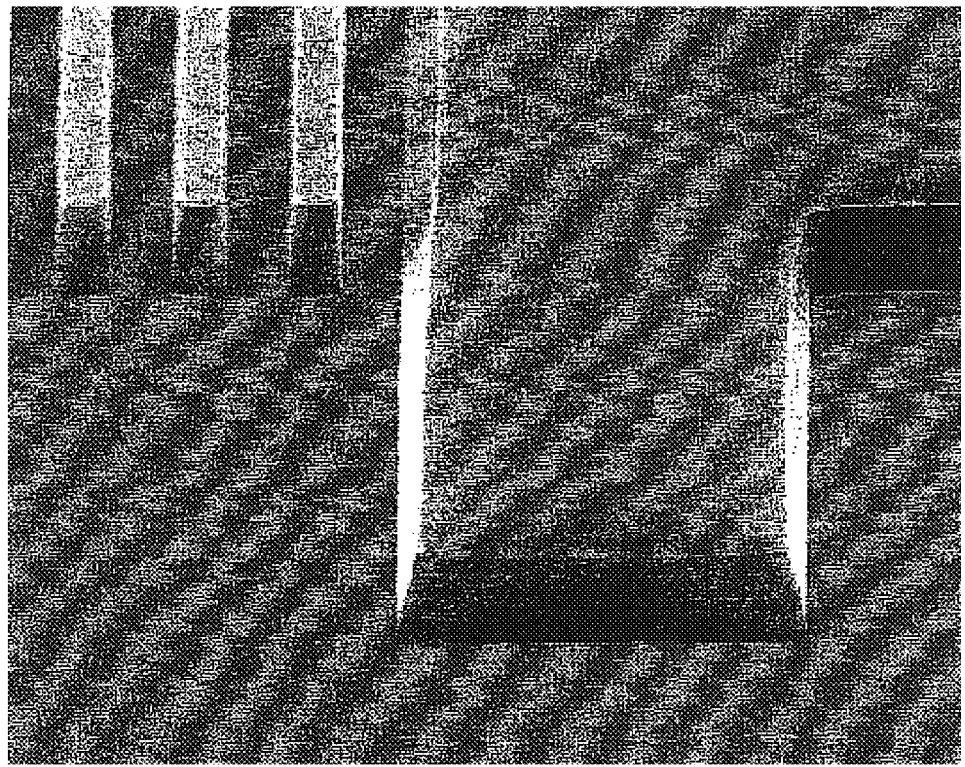
FIG. 3 shows images of several 0.7 micron lines along with a large structure showing thermal distortion.
Figure 3:
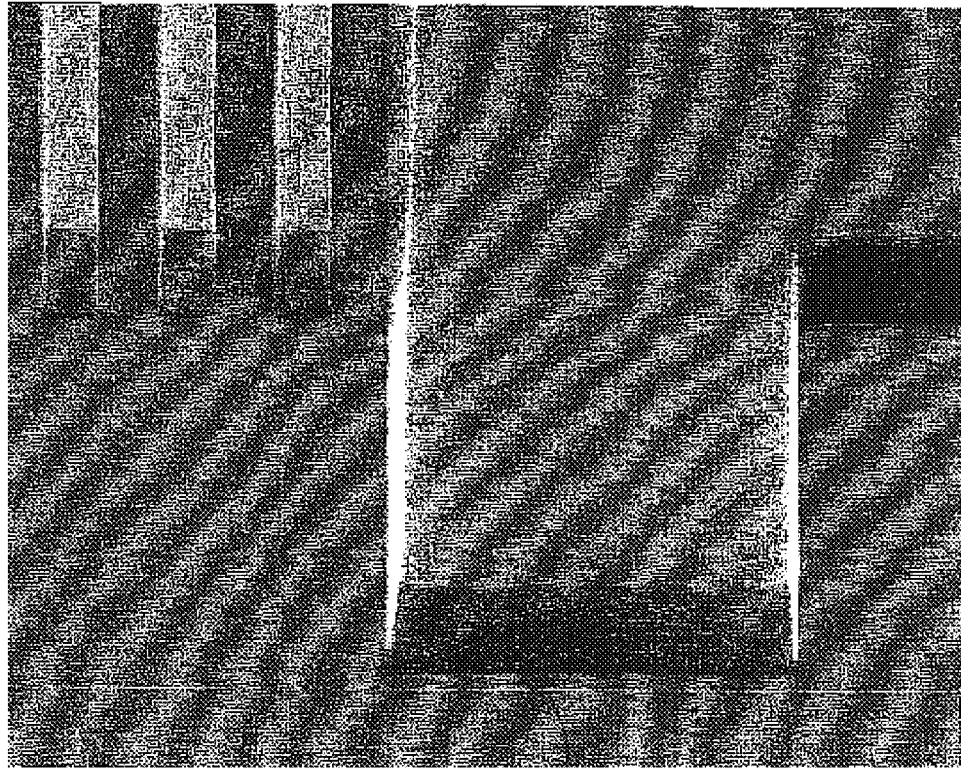

FIG. 2 is another plot of film thickness removed versus log of exposure (exposure energy being measured in millijoules/square centimeter (mJ/cm$^2$). Plot (a) utilizes Formulation D, and plot (b) utilizes Formulation E from Table 2 above. Plot (b), employing a mixture of the meta resin and the MPT resin clearly shows better contrast than plot (a), employing a mixture of the metal resin and the ortho resin. FIG. 3 shows images of several 0.7 micron lines along with a large structure showing thermal distortion after baking at 120° C. for 2 minutes following development with AZ® MIF 300 developer. FIG. 3(a) utilizes Formulation D of Example 2 (Table 2), while FIG. 3(b) utilizes Formulation E of Table 2. The dose to print (DTP) value for the image in FIG. 3(a) is 125 mJ/cm$^2$, while that for FIG. 3(b) is 245 mJ/cm$^2$. The large structure in FIG. 3(b) clearly shows better thermal stability as can be seen by looking at the edges of the structure.

Example 3

The formulations listed in Table 3 below are used to determine and dose to print (DTP) values listed in Table 4.

TABLE 3

Formulation (Numbers represent weight in parts)

| Ingredient | E | G | H | I | J | K | L | M |
|---|---|---|---|---|---|---|---|---|
| MPT resin-fast[5] | 1.6 | 1.6 | 1.6 | 1.6 | 1.6 | 1.6 | — | — |
| MPT resin-slow[7] | — | — | — | — | — | — | 1.6 | 1.6 |
| Meta resin-slow[6] | 0.4 | 0.4 | 0.4 | 0.4 | 0.4 | — | 0.4 | — |
| Meta resin-fast[8] | — | — | — | — | — | 0.4 | — | 0.4 |
| DR 167[9] | 0.60 | — | — | — | — | — | — | — |
| DR 154[10] | — | 0.60 | — | — | — | — | — | — |
| DR 153/155[11] | — | — | 0.60 | — | — | — | — | — |
| DR 166/168[12] | — | — | — | 0.60 | — | — | — | — |
| NK 280[13] | — | — | — | — | 0.60 | 0.60 | 0.60 | 0.60 |
| 2-heptanone | 6.06 | 6.06 | 6.06 | 6.06 | 6.06 | 6.06 | 6.06 | 6.06 |

[5,6]Same as footnotes from Table 2;
[7]An unfractionated novolak resin based on m-cresol/p-cresol/trimethylphenol, having a dissolution rate of 260 Å/sec using AZ ® MIF-300 developer (0.261N tetramethylammonium hydroxide (TMAH).; available from AZ Electronic Materials, Clariant Corporation;
[8]A fractionated novolak resin based on m-cresol, having a dissolution rate of 113 Å/sec using AZ ® MIF-300 developer; available from AZ Electronic Materials, Clariant Corporation;
[9]Same as footnote 8 of Table 2;
[10]Photoactive compound sensitizer-An o-quinone diazidesulfonyl ester of a polyhydroxy compound represented by structure (VI) in the specification, wherein an average of 2.8 hydroxy groups are esterified; available from AZ Electronic Materials, Clariant Corporation;
[11]A 50/50 mixture of DR 153 and DR155-photoactive compounds which are o-quinone diazidesulfonyl ester of a polyhydroxy compound represented by structure (VII) in the specification; DR 153 is a bis-ester (average of 2 hydroxy groups esterified), and DR 154 has an average of 3.75 hydroxy groups that are esterified; available from AZ Electronic Materials, Clariant Corporation;
[12]A 50/50 mixture of DR 166 and DR168-photoactive compound which are o-quinone diazidesulfonyl ester of a polyhydroxy compound represented by structure (VII) in the specification; DR 166 is a bis-ester (average of 2 hydroxy groups esterified), and DR 168 has an average of 3.75 hydroxy groups that are esterified; available from AZ Electronic Materials, Clariant Corporation;
[13]photoactive compound which is an o-quinone diazidesulfonyl ester of a polyhydroxy compound represented by structure (IV) in the specification; an average of 2.8 hydroxy groups are esterified.

TABLE 4

Resolution and DTP values for formulations of Table 3

| Formulation | Resolution ($\mu$m), DTP (mJ/cm$^2$) |
|---|---|
| E | 0.36, 245 |
| G | 0.36, 215 |
| H | 0.34, 215 |
| I | 0.38, 230 |
| J | 0.40, 110 |
| K | 0.45, 80 |
| L | 0.40, 155 |

A comparison of the resolution values for Formulation E, and G–J indicates that the hydrophobicity of the backbone of photoactive compounds does not have a strong effect on the performance on the formulations comprising the resin mixtures, since the resolution values are similar, despite the use of different photoactive compounds (PACs) in the formulations.

Each of the documents referred to above is incorporated herein by reference in its entirety, for all purposes. Except in the Examples, or where otherwise explicitly indicated, all numerical quantities in this description specifying amounts and concentrations of materials, reaction and process conditions (such as temperature, time), and the like are to be understood to be modified by the word "about".

It must be noted that as used in this specification and the appended claims, the singular forms "a," "an," and "the"

include plural reference unless the context clearly dictates otherwise. Unless defined otherwise all technical and scientific terms used herein have the same meaning as commonly understood to one of ordinary skill in the art to which this invention belongs.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. An alkali-soluble, film-forming novolak resin mixture comprising at least two novolak resins, each novolak resin comprising the addition-condensation reaction product of at least one phenolic compound with at least one aldehyde source, wherein the phenolic compound for first novolak resin comprises 90–100 mole % of meta-cresol, the phenolic compound for the second novolak resin comprises less than 50 mole % of meta-cresol, and the novolak resin mixture comprises about 10–20% by weight of the first novolak resin and about 80–90% by weight of the second novolak resin, with the proviso that the first and second novolak resins are not made from identical phenolic compounds.

2. The novolak resin mixture of claim 1, wherein the phenolic compound for the second novolak resin comprises more than 50 mole % of para-cresol.

3. The novolak resin mixture of claim 1, wherein the phenolic compound for the second novolak resin comprises about 30–45 mole % of meta-cresol, and about 55–75 mole % of para-cresol.

4. The novolak resin mixture of claim 1, wherein the first novolak resin has a weight average molecular weight ($M_w$) of about 6,000 to about 20,000.

5. The novolak resin mixture of claim 1, wherein the aldehyde source is at least one compound selected from the group consisting of formaldehyde, paraformaldehyde, trioxane, acetaldehyde, chloroacetaldehyde, and reactive equivalents thereof.

6. A photosensitive composition, comprising an admixture of:
   a) the novolak resin mixture of claim 1;
   b) at least one o-quinone photoactive compound; and
   c) at least one photoresist solvent.

7. The photosensitive composition of claim 6, wherein the novolak resin mixture comprises about 5–40% by weight of the photosensitive composition.

8. The photosensitive composition of claim 6, wherein the o-quinone photoactive compound comprises about 10–60% by weight of the novolak resin mixture.

9. The photosensitive composition of claim 6, wherein the solvent comprises about 30–90% by weight of the photosensitive composition.

10. The photosensitive composition of claim 6, that is a positive-working photosensitive composition.

11. The photosensitive composition of claim 6, wherein the o-quinone photoactive compound is a diazonaphthoquinone sulfonic acid ester of a polyhydroxy compound, the polyhydroxy compound having 2–7 phenolic moieties.

12. The photosensitive composition of claim 6, wherein the solvent is selected from propylene glycol alkyl ether acetate, 3-methyl-3-methoxy-butanol, ethyl lactate, 2-heptanone, anisole, propylene glycol monomethyl ether, ethyl ethoxy propionate, n-butyl acetate and mixtures of at least two thereof.

13. A method for producing a microelectronic device by forming an image on a substrate, said method comprising:
   a) providing the photosensitive composition of claim 6,
   b) thereafter, coating a suitable substrate with the photoresist composition from step a);
   c) thereafter, heat treating the coated substrate until substantially all of the solvent is removed; image-wise exposing the coated substrate; and then removing the imagewise exposed or, alternatively, the unexposed areas of the coated substrate with a suitable developer.

14. An alkali-soluble, film-forming novolak resin mixture comprising at least two novolak resins, each novolak resin comprising the addition-condensation reaction product of at least one phenolic compound with at least one aldehyde source, wherein the phenolic compound for first novolak resin comprises 90–100 mole % of meta-cresol, the phenolic compound for the second novolak resin comprises less than 50 mole % of meta-cresol, and the second novolak resin has a weight average molecular weight ($M_w$) of about 2000 to about 9000, with the proviso that the first and second novolak resins are not made from identical phenolic compounds.

* * * * *